United States Patent
Wang

(10) Patent No.: US 9,520,483 B2
(45) Date of Patent: Dec. 13, 2016

(54) METHOD FOR MANUFACTURING SEMICONDUCTOR DEVICE

(71) Applicant: Semiconductor Manufacturing International (Shanghai) Corporation, Shanghai (CN)

(72) Inventor: Xinpeng Wang, Beijing (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/994,927

(22) Filed: Jan. 13, 2016

(65) Prior Publication Data

US 2016/0225877 A1    Aug. 4, 2016

(30) Foreign Application Priority Data

Feb. 2, 2015  (CN) .......................... 2015 1 0053282

(51) Int. Cl.
| | | |
|---|---|---|
| H01L 21/285 | (2006.01) | |
| H01L 29/66 | (2006.01) | |
| H01L 21/283 | (2006.01) | |
| H01L 21/306 | (2006.01) | |
| H01L 21/308 | (2006.01) | |
| H01L 21/8234 | (2006.01) | |

(52) U.S. Cl.
CPC ....... *H01L 29/66545* (2013.01); *H01L 21/283* (2013.01); *H01L 21/28587* (2013.01); *H01L 21/3085* (2013.01); *H01L 21/30604* (2013.01); *H01L 21/823437* (2013.01)

(58) Field of Classification Search
CPC ...................... H01L 21/02296; H01L 21/8232
See application file for complete search history.

(56) References Cited

U.S. PATENT DOCUMENTS

2015/0091100 A1\* 4/2015 Xie et al. .......... H01L 21/76224
                                                                257/401
2015/0187905 A1\* 7/2015 Cai et al. ............ H01L 29/6681
                                                                257/288

\* cited by examiner

*Primary Examiner* — Cheung Lee
(74) *Attorney, Agent, or Firm* — Innovation Counsel LLP

(57) ABSTRACT

A method for manufacturing a semiconductor device may include forming a cavity between two insulating portions that are positioned on a semiconductor substrate. The cavity may include a first cavity portion and a second cavity portion. The second cavity portion may be positioned between the semiconductor substrate and the first cavity portion. A width of the second cavity portion may be less than a width of the first cavity portion. The method may further include providing a set of gate metal material through the first cavity portion into the second cavity portion for forming a metal gate member of the semiconductor device.

19 Claims, 7 Drawing Sheets

METHOD FOR MANUFACTURING SEMICONDUCTOR DEVICE

CROSS-REFERENCE TO RELATED APPLICATION

This application claims priority to and benefit of Chinese Patent Application No. 201510053282.6, filed on 2 Feb. 2015; the Chinese Patent Application is incorporated herein by reference in its entirety.

BACKGROUND

The technical field is related to a method for manufacturing a semiconductor device.

A semiconductor device may include a metal gate member. In a manufacturing process of the semiconductor device, the metal gate member may be formed through deposition of metal material into a cavity. Because of a substantially small critical dimension of the cavity, and/or because of a substantially large aspect ratio of the cavity, unwanted voids may be formed in the metal gate member. As a result, quality, performance, and/or reliability of the semiconductor device may be unsatisfactory.

SUMMARY

An embodiment may be related to a method for manufacturing a semiconductor device. The method may include forming a cavity between two insulating portions that are positioned on a semiconductor substrate. The cavity may have a first cavity portion and a second cavity portion. The second cavity portion may be positioned between the semiconductor substrate and the first cavity portion. A width of the second cavity portion may be less than a width of the first cavity portion. The method may include providing a set of gate metal material through the first cavity portion into the second cavity portion for forming a metal gate member of the semiconductor device.

The two insulating portions include two nitride portions and two oxide portions. The two nitride portions may be positioned between the two oxide portions and may be shorter than the two oxide portions.

A bottom portion of the first cavity portion may be positioned between the semiconductor substrate and a top portion of the first cavity portion and may be narrower than the top portion of the first cavity portion. A cross section of the first cavity portion may have a trapezoid shape.

A width of the metal gate member may be equal to a width of the bottom portion of the first cavity portion in a direction parallel to a bottom side of the semiconductor substrate. A thickness of the metal gate member may be equal to a height of the second cavity portion in a direction perpendicular to the bottom side of the semiconductor substrate.

The method may include providing a dummy gate structure on the semiconductor substrate. The dummy gate structure may include a dummy gate member, an intermediate layer, and a mask layer. The dummy gate member may be positioned between the semiconductor substrate and the intermediate layer. The intermediate layer may be positioned between the dummy gate member and the mask layer.

The method may include the following steps: providing an insulating structure, such that the dummy gate structure may be positioned between two portions of the insulating structure; providing an etch-stop material layer that covers both the dummy gate structure and the insulating structure; providing a dielectric material layer that covers the etch-stop material layer; removing each of the mask layer, a portion of the etch-stop material layer that is positioned above the intermediate layer, and a portion of the dielectric material layer that is positioned above the intermediate layer; removing the intermediate layer or a remaining portion of the intermediate layer; partially removing a remaining portion of the insulating structure to form the first cavity portion; and removing the dummy gate member to form the second cavity portion.

A thickness of the dummy gate member may be equal to and/or related to a thickness of the metal gate member. The method may include configuring a thickness of the dummy gate member according to a predetermined thickness of the metal gate member.

A height of the first cavity portion may be less than or equal to a thickness of the intermediate layer. The height of the first cavity portion may be equal to a thickness of the remaining portion of the intermediate layer. The method may include controlling the height of the first cavity portion by partially removing the intermediate layer in a process step performed for removal of the mask layer, the portion of the etch-stop material layer, and the portion of the dielectric material layer. The method may include controlling a height of the first cavity portion by configuring a thickness of the intermediate layer. The method may include configuring a thickness of the intermediate layer according to a predetermined height of the first cavity portion.

The dummy gate member may be formed of a polycrystalline silicon material. The intermediate layer may be formed of a metal material. The mask layer may include a silicon oxide layer and a silicon nitride layer. The silicon oxide layer may be positioned between the intermediate layer and the silicon nitride layer.

The method may include performing a wet strip process for removing the dummy gate member. A removal rate associated with a material of the dummy gate member may be higher than a removal rate associated a material of the dielectric material layer.

The method may include: etching the remaining portion of the insulating structure to form the first cavity portion and the two insulating portions. The remaining portion of the insulating structure may include two nitride members and two oxide members. The two nitride members may be positioned between the two oxide members. An etch rate associated with the nitride members may be higher than an etch rate associated with the oxide members in the etching. The etch rate associated with the nitride members may be greater than or equal to 30 times the etch rate associated with the oxide members in the etching. The method may include: using $CHF_3$ and $O_2$ in the etching. A depth of material removal associated with the etching may be in a range of 10 angstroms to 100 angstroms.

According to embodiments, in a process of forming a metal gate member in a semiconductor device, metal material may be deposited through a funnel structure. Therefore, unwanted voids may be minimized or substantially prevented in the metal gate member. Advantageously, satisfactory quality, performance, and/or reliability of the semiconductor device may be obtained.

The above summary is related to some of many embodiments disclosed herein and is not intended to limit the scope of embodiments.

DETAILED DESCRIPTION

Figure 1:
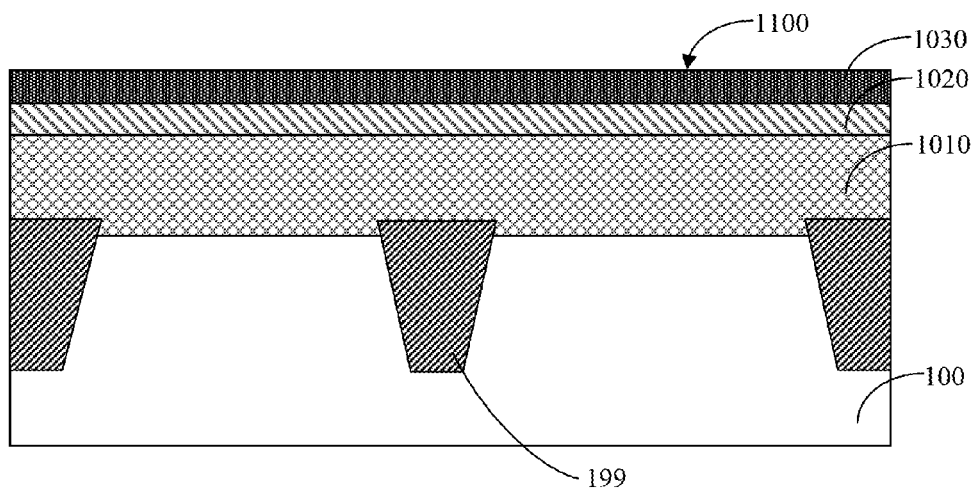
FIG. 1, FIG. 2, FIG. 3, FIG. 4, FIG. 5, FIG. 6, FIG. 7, FIG. 8, FIG. 9, FIG. 10, and FIG. 11 show schematic diagrams (e.g., schematic cross-sectional views) that illustrate elements and/or structures formed in a method for manufacturing a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1, FIG. 2, FIG. 3, FIG. 4, FIG. 5, FIG. 6, FIG. 7, FIG. 8, FIG. 9, FIG. 10, and FIG. 11 show schematic diagrams (e.g., schematic cross-sectional views) that illustrate elements and/or structures formed in a method for manufacturing a semiconductor device 1000 (illustrated in FIG. 11) in accordance with one or more embodiments. FIG. 12 shows a flowchart that illustrates steps in a method for manufacturing the semiconductor device 1000 in accordance with one or more embodiments.

Referring to FIG. 12, the method may include steps 1201, 1202, 1203, 1204, 1205, 1206, 1207, 1208, and 1209. Sequences of some of the steps may be changed in some embodiments.

Figure 2:
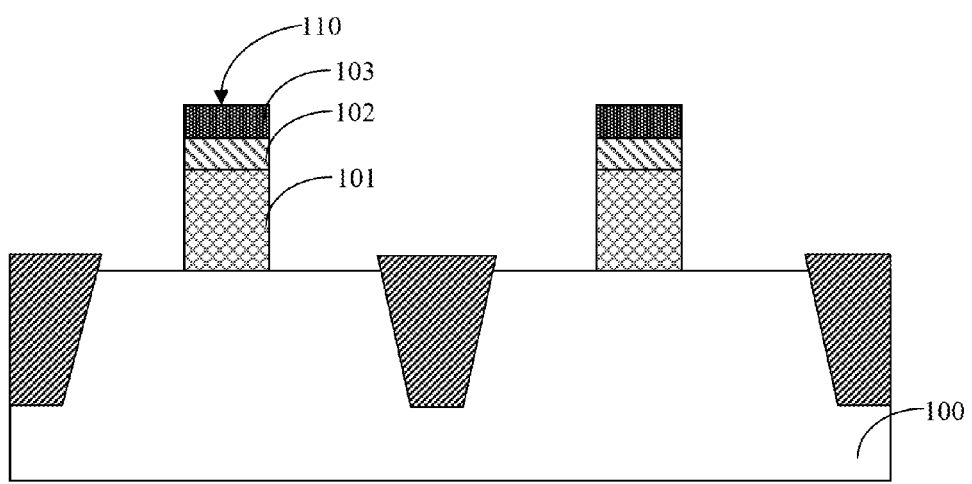
Figure 3:
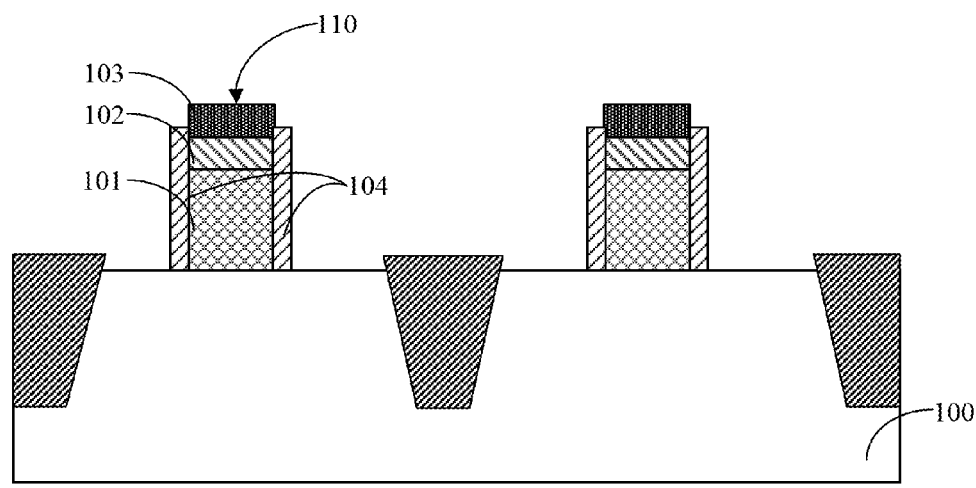

Referring to FIG. 12, FIG. 1, and FIG. 2, the step 1201 may include providing a dummy gate structure 110 on a semiconductor substrate 100. The step 1201 may include the following sub-steps: sequentially forming a dummy gate material layer 1010, a buffer material layer 1020, and a mask material layer 1030 to form a stack structure 1100 on the substrate 100; and partially removing (e.g., through dry etching and/or wet etching) the stack structure 1100 to form the dummy gate structure 110.

The semiconductor substrate 100 may be or may include at least one of a monocrystalline silicon substrate, a polycrystalline silicon substrate, a silicon-on-insulator substrate, and one or more other suitable substrates. The substrate 100 may include isolation members (e.g., an isolation member 199) and doped wells.

The dummy gate structure 110 may include a dummy gate member 101, an intermediate layer 102, and a mask layer 103. The dummy gate member 101 may be positioned between the semiconductor substrate 100 and the intermediate layer 102. The intermediate layer 102 may be positioned between the dummy gate member 101 and the mask layer 103.

Each of the dummy gate member 101, the intermediate layer 102, and the mask layer 103 may have a single-layer structure or a multilayer structure. The dummy gate member 101 may be or may include a polycrystalline silicon member. The intermediate layer 102 may be or may include a metal layer. The mask layer 103 may include a silicon oxide layer and a silicon nitride layer. The silicon oxide layer may be positioned between the intermediate layer 102 and the silicon nitride layer.

Referring to FIG. 12, FIG. 2, FIG. 3, and FIG. 4, subsequent to the step 1201, the step 1202 may include providing an insulating structure 120, such that the dummy gate structure 110 may be positioned between two portions of the insulating structure 120. The insulating structure may include two insulating members 104 and two insulating members 105. The dummy gate structure 110 may be positioned between the two insulating members 104. The two insulating members 104 may be positioned between the two insulating members 105.

The top side of each of the insulating members 104 may not be lower than the top side of the dummy gate member 101 with reference to the substrate 100. The top side of each of the insulating members 104 may be higher than the top side of dummy gate member 101 and may be lower than the top side of the intermediate layer 102. The top side of each of the insulating members 104 may be higher than the top side of the intermediate layer 102 and may be lower than the top side of the mask layer 103.

The top side of each of the insulating members 105 may not be lower than the top side of the dummy gate member 101 with reference to the substrate 100. The top side of each of the insulating members 105 may be higher than the top side of dummy gate member 101 and may be lower than the top side of the intermediate layer 102. The top side of each of the insulating members 105 may be higher than the top side of the intermediate layer 102 and may be lower than the top side of the mask layer 103. The top side of each of the insulating members 105 may be higher than the top side of each of the insulating members 104.

Each of the insulating members 104 and each of the insulating members 105 may have a single-structure or a multilayer structure. Each of the insulating members 104 may be or may include a silicon nitride member. Each of the insulating members 105 may include a silicon oxide member and/or a silicon nitride member.

Figure 4:
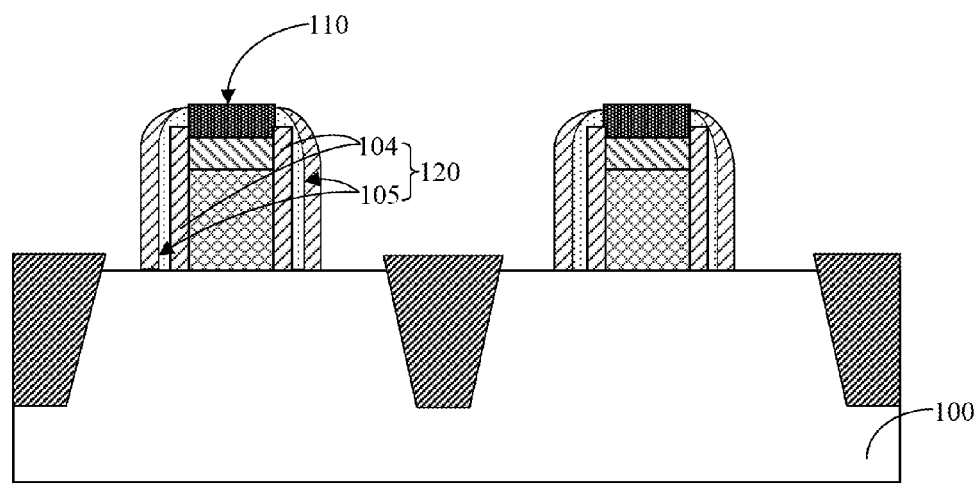
Figure 5:
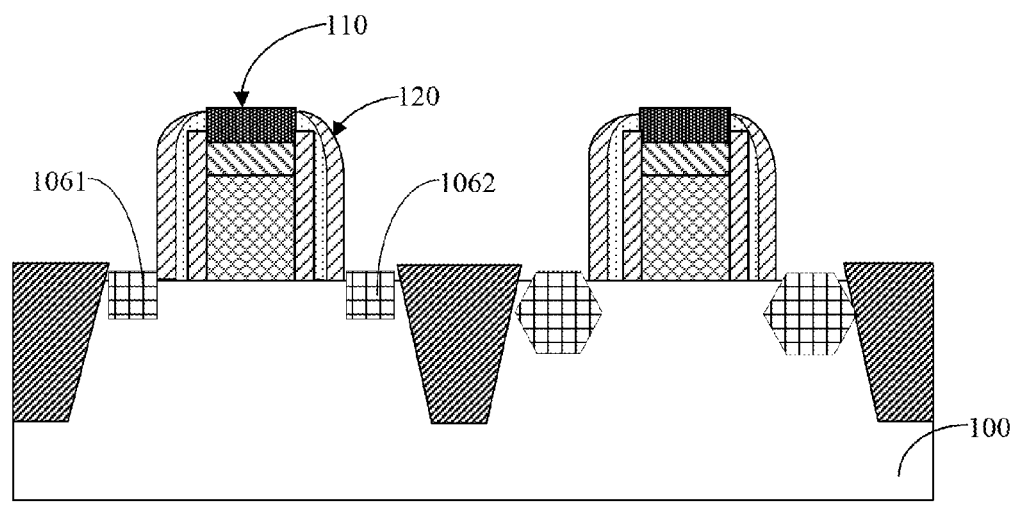

Referring to FIG. 12, FIG. 4, and FIG. 5, subsequent to the step 1202, the step 1203 may include forming two doped regions 1061 and 1062 at two opposite sides of the dummy gate structure 110 in the substrate 100. The doped regions 1061 and 1062 may respectively function as a source region and a drain region. The doped regions 1061 and 1062 may be formed through ion implantation and/or one or more other suitable processes.

The step 1203 may include forming trenches at the two opposite sides of the dummy gate structure 110 in the substrate 100 and forming an embedded silicon-germanium (SiGe) layer and/or an embedded silicon carbide (SiC) layer.

Figure 6:
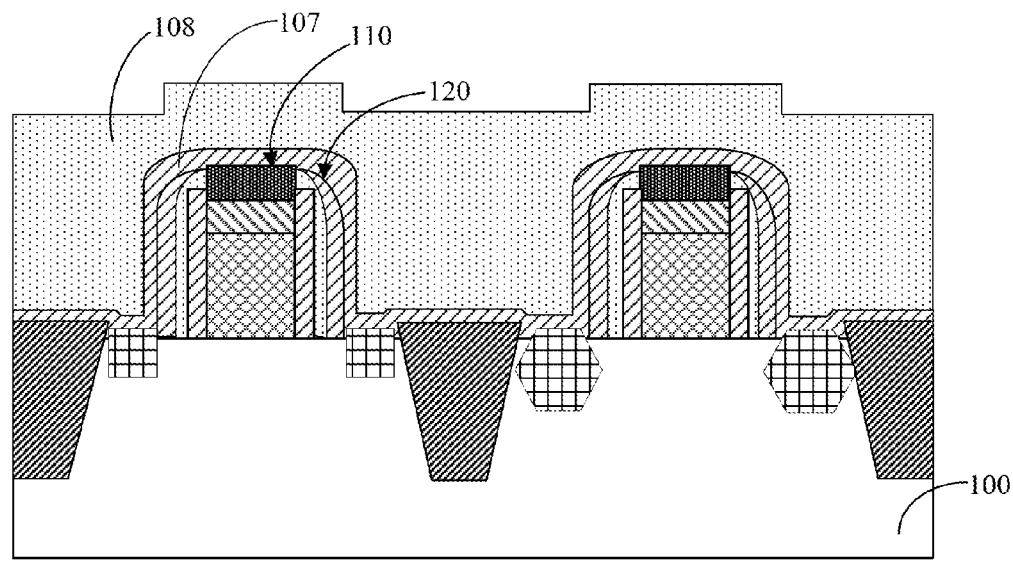

Referring to FIG. 12, FIG. 5, and FIG. 6, subsequent to the step 1203, the step 1204 may include the following sub-steps: providing an etch-stop material layer 107 that covers both the dummy gate structure 110 and the insulating structure 120; and providing a dielectric material layer 108 that covers the etch-stop material layer. The etch-stop material layer 107 may be formed of silicon nitride and may be formed through a deposition process and/or one or more other suitable processes. The dielectric material layer 108 may be formed of silicon oxide and may be formed through a deposition process and/or one or more other suitable processes.

Figure 7:
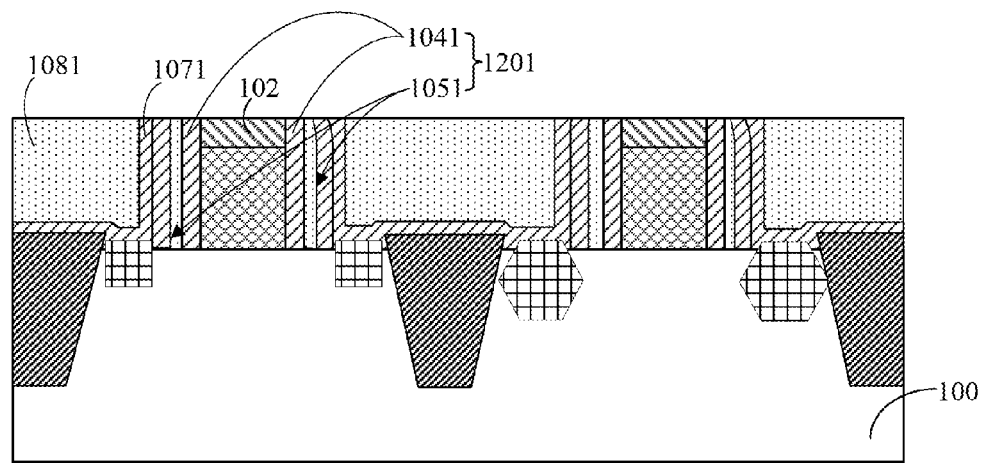

Referring to FIG. 12, FIG. 6, and FIG. 7, subsequent to the step 1204, the step 1205 may include removing each of the mask layer 103, a portion of the etch-stop material layer 107 that is positioned above the intermediate layer 102 (with reference to the substrate 100), and a portion of the dielectric material layer 1081 that is positioned above the intermediate layer 102 (with reference to the substrate 100). A portion of the insulating structure 120 that is positioned above the intermediate layer 102 (with reference to the substrate 100) also may be removed. The material removal in the step 1205 may be performed through a chemical-mechanical polishing (CMP) process and/or one or more other suitable processes.

As a result, an insulating structure 1201, an etch-stop material layer 1071, and a dielectric material layer 1081 (i.e., remaining portions of the insulating structure 120, the etch-stop material layer 107, and the dielectric material layer 108) may remain on the substrate 100. The insulating structure 1201 may include insulating members 1041 (i.e., remaining portions of the insulating members 104) and insulating members 1051 (i.e., remaining portions of the insulating members 105).

In an embodiment, the intermediate layer 102 may be completely or substantially retained in the step 1205. In an embodiment, the intermediate layer 102 may be partially removed in the step 1205.

Figure 8:
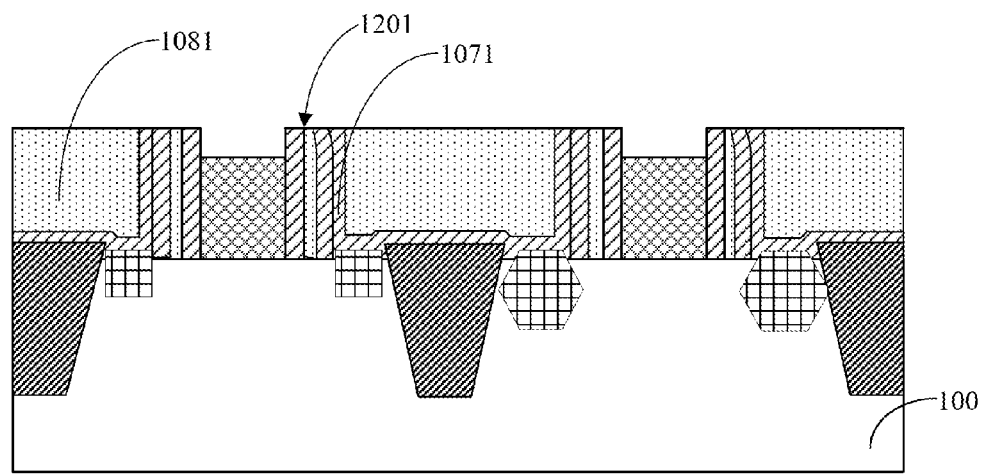

Referring to FIG. 12, FIG. 7, and FIG. 8, subsequent to the step 1205, the step 1206 may include removing the intermediate layer 102 (if the intermediate layer 102 has been substantially completely retained in the step 1205) or removing the remaining portion of the intermediate layer 102 (if the intermediate layer 102 has been partially removed in the step 1205). The removal of the intermediate layer 102 or the remaining portion of the intermediate layer 102 may be performed though a wet etching process and/or one or more suitable processes.

Figure 9:
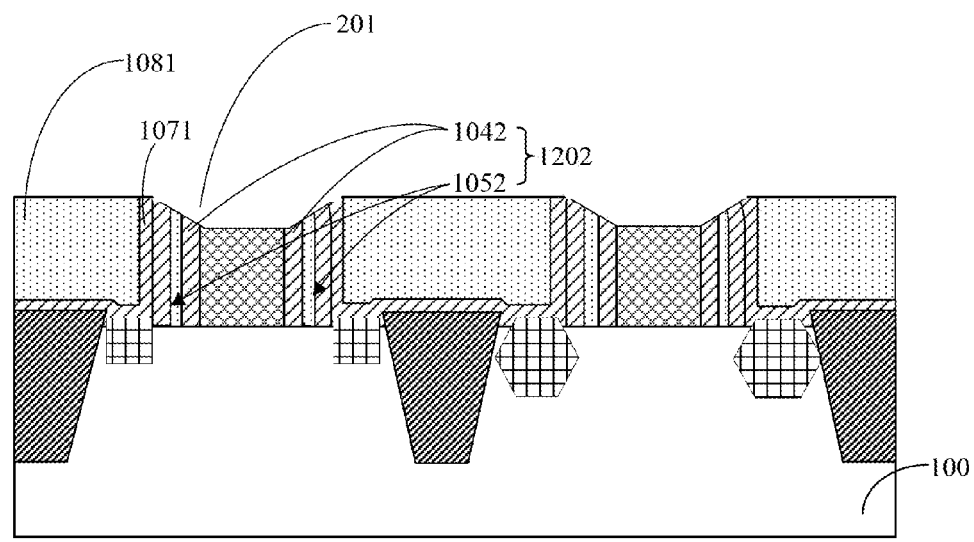

Referring to FIG. 12, FIG. 8, and FIG. 9, subsequent to the step 1206, the step 1207 may include partially removing the insulating structure 1201 (which is a remaining portion of the insulating structure 120) to form a cavity portion 201. As a result, an insulating structure 1202 (i.e., a remaining portion of the insulating structure 1201) may remain on the substrate 100. The insulating structure 1202 may include two insulating portions 1042 (i.e., remaining portions of the insulating members 1041) and two insulating portions 1052 (i.e., remaining portions of the insulating members 1051).

The cavity portion 1201 may be positioned between the insulating portions 1042. A bottom portion of the cavity portion 201 may be positioned between the semiconductor substrate 100 and a top portion of the cavity portion 201 and may be narrower than the top portion of the cavity portion 201. A cross section of the cavity portion 201 may have a trapezoid shape or a funnel shape.

The insulating members 1041 and the insulating portions 1042 may be or may include nitride members, e.g., silicon nitride members. The insulating portions 1042 may be positioned between the insulating portions 1052 and may be shorter than the insulating portions 1052 (in terms of a maximum height with reference to the substrate 100). The insulating members 1051 and the insulating portions 1052 may be or may include oxide members, e.g., silicon oxide members.

The step 1207 may include etching the insulating structure 1201 to form the cavity portion 201 and the insulating portions 1042 and 1052. In the etching process, an etch rate associated with the nitride members (e.g., silicon nitride members) of the insulating members 1041 may be higher than an etch rate associated with the oxide members (e.g., silicon oxide members) of the insulating members 1051. The etch rate associated with the nitride members may be greater than or equal to 30 times the etch rate associated with the oxide members in the etching. As a result, the maximum height(s) of the insulating portions 1042 may be less than the maximum height(s) of the insulating portions 1052. In the etching process, $CHF_3$ and $O_2$ may be used as etching gases. A depth of material removal associated with the etching process may be in a range of 10 angstroms to 100 angstroms.

Figure 10:
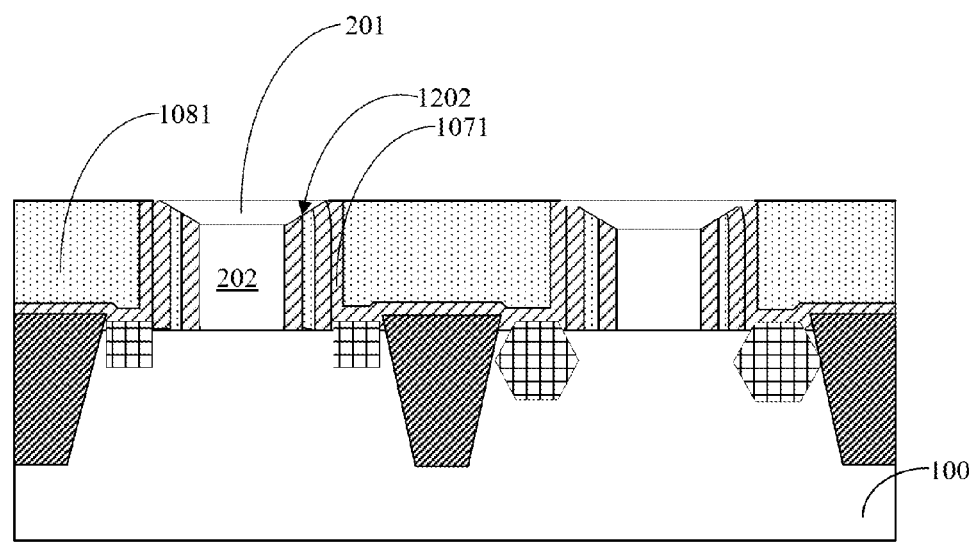

Referring to FIG. 12, FIG. 9, and FIG. 10, subsequent to the step 1207, the step 1208 may include removing the dummy gate member 101 to form a cavity portion 202. As a result, a cavity that includes the cavity portion 201 and the cavity portion 202 may be formed between two portions of the insulating structure 1202. The cavity portion 202 may be positioned between the semiconductor substrate 100 and the cavity portion 201. A width (e.g., the maximum width) of the cavity portion 202 may be less than a width (e.g., the maximum width) of the cavity portion 201.

The step 1208 may include performing a wet strip process (e.g., a wet etching process) for removing the dummy gate member 101. A removal rate associated with a material of the dummy gate member 101 may be higher than a removal rate associated a material of the dielectric material layer 1081 (i.e., the material of the dielectric material layer 108). Therefore, the dielectric material layer 1081 may be substantially retained.

Figure 11:
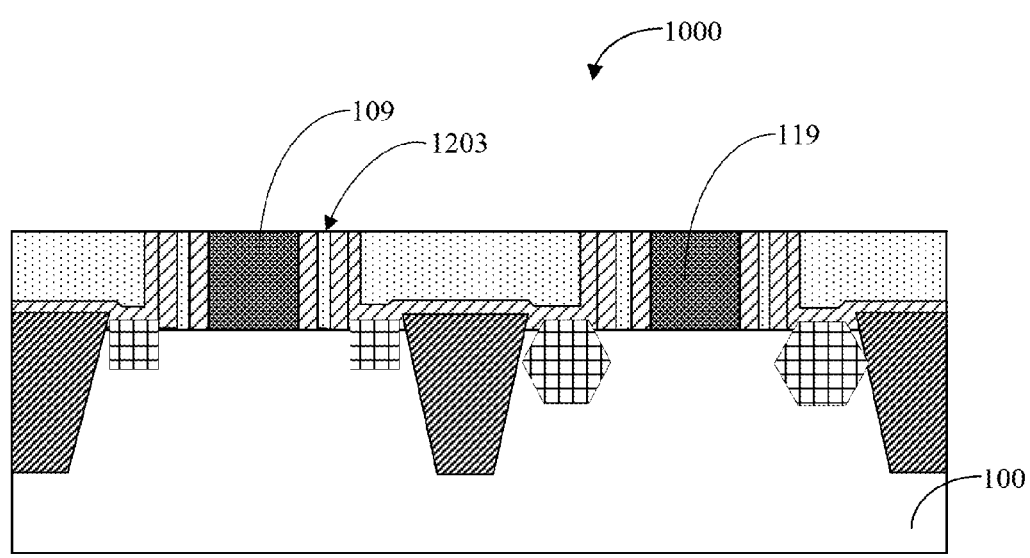
Figure 12:
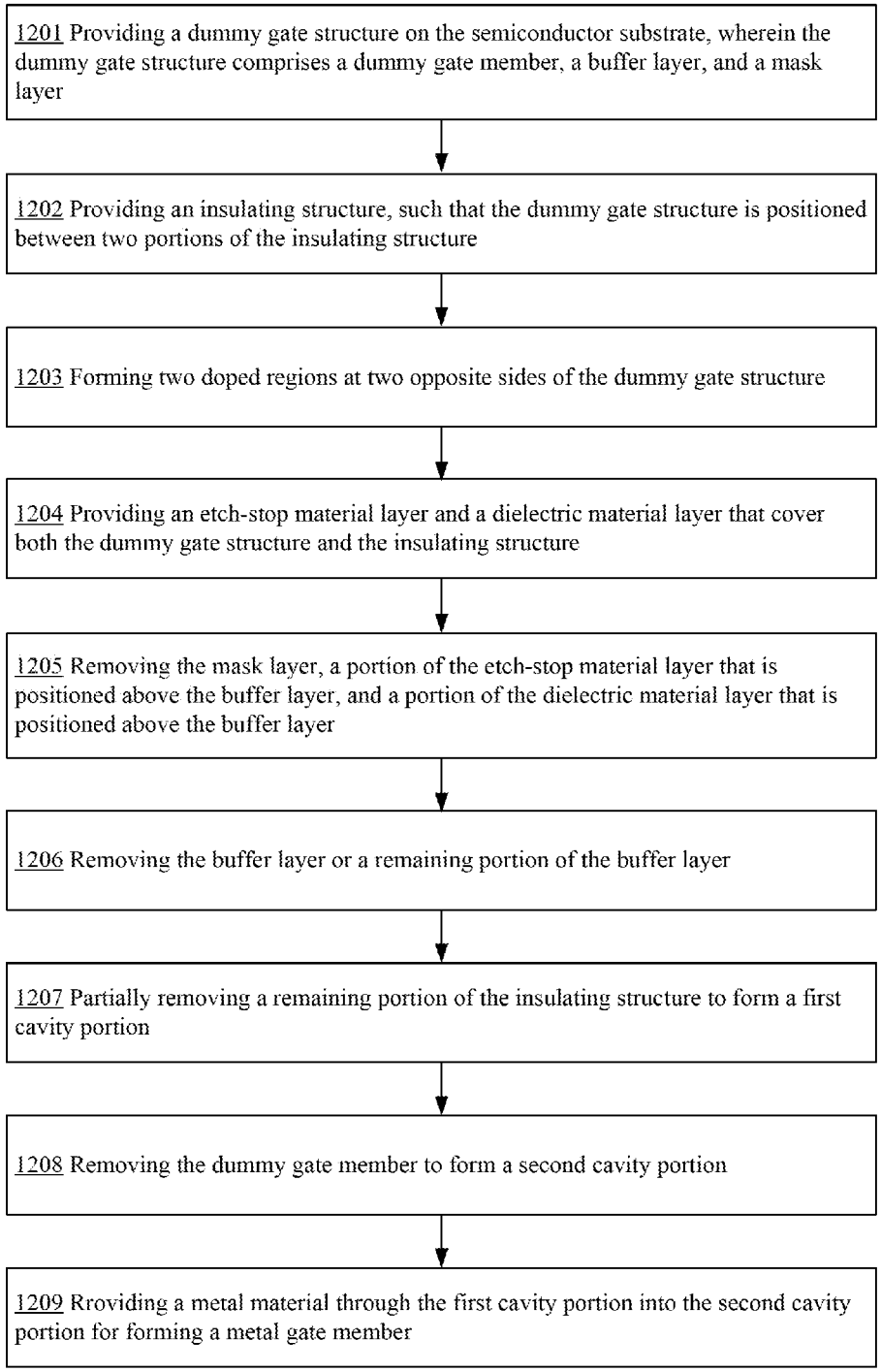
FIG. 12 shows a flowchart that illustrates steps in a method for manufacturing a semiconductor device in accordance with one or more embodiments.

Referring to FIG. 12, FIG. 10, and FIG. 11, subsequent to the step 1208, the step 1209 may include providing a first set of a gate metal material through the cavity portion 201 into the cavity portion 202 for forming a metal gate member 109 of the semiconductor device 1000. The step 1209 may include the following steps: providing (e.g., through deposition) a set of high-k dielectric material having a dielectric constant greater than or equal to 3.9 through the cavity portion 201 into the cavity portion 202; subsequently providing (e.g., through deposition) the first set of the gate metal material in the cavity portion 202 (and a second set of the gate metal material in the cavity portion 201); and subsequently (removing the second set of the gate metal material) and partially removing the insulating structure 1202, the etch-stop material layer 1071, and the dielectric material layer 1081 thorough a chemical-mechanical polishing (CMP) process and/or one or more other suitable processes. As a result, the top surfaces of the remaining portions of the insulating structure 1202, the etch-stop material layer 1071, and the dielectric material layer 1081 may be substantially flush with the top surface of the metal gate member 109. The metal gate member 109 may be positioned between two portions of a spacer structure 1203, wherein the spacer structure 1203 may include the remaining portions of the insulating structure 1202. The spacer structure 1203 may ensure sufficient isolation of the metal gate member 109 from at least one of the doped regions 1061 and 1062.

The metal gate member 109 may include a high-k dielectric layer formed of the high-k dielectric material and may include a gate metal layer formed of the gate metal material. The gate metal material may have a predetermined work function value. The metal gate member 109 may be a gate member of a transistor unit, e.g., a p-channel metal-oxide-semiconductor field-effect (PMOS) transistor unit or an n-channel metal-oxide-semiconductor field-effect (NMOS) transistor unit, of the semiconductor device 1000.

Another metal gate member 119 also may be formed in the semiconductor device 100. The metal gate member 119 may be a gate member of an NMOS transistor unit of a PMOS transistor unit of the semiconductor device 1000. The metal gate member 119 may be formed using the method identical to or analogous to the method used for forming the metal gate member 109. The gate metal material of the metal gate member 119 may be identical to or different from the gate metal material of the metal gate member 109. In an embodiment, the metal gate member 109 and the metal gate member 119 may be substantially simultaneously formed through same process steps.

A width of the metal gate member 109 may be substantially equal to a width of the bottom portion of the cavity portion 201 and/or a width of the cavity portion 202 in a direction parallel to a bottom side of the semiconductor substrate 100. A thickness of the metal gate member 109 may be substantially equal to a height of the cavity portion 202 in a direction perpendicular to the bottom side of the semiconductor substrate 100.

The height of the cavity portion 202 may be substantially determined by a thickness of the dummy gate member in the direction perpendicular to the bottom side of the semiconductor substrate 100. The thickness of the metal gate member 109 may be substantially equal to and/or related to the thickness of the dummy gate member 101. The method may include configuring the thickness of the dummy gate member 101 and/or a thickness of the dummy gate material layer 1010 according to a predetermined thickness (or an optimum thickness) of the metal gate member 109.

A height of the cavity portion 201 may be equal to or less than a thickness of the intermediate layer 102. The height of the cavity portion 201 may be substantially equal to a thickness of the intermediate layer 102 if the intermediate layer 102 has been substantially completely retained in the step 1205. The height of the cavity portion 201 may be equal to a thickness of the remaining portion of the intermediate layer 102 if the intermediate layer has been partially removed in the step 1205. The method may include controlling the height of the cavity portion 201 by substantially completely retaining or partially removing the intermediate layer 102 in the step 1205.

The method may include controlling a height of the cavity portion 201 by configuring a thickness of the intermediate layer 102. The method may include configuring a thickness of the intermediate layer 102 according to a predetermined height (or an optimum height) of the cavity portion 201. Therefore, the cavity that includes the cavity portion 201 and the cavity portion 202 may have a funnel structure that has a desirable aspect ratio for facilitating deposition of the gate metal material into the cavity portion 202. As a result, unwanted voids may be minimized or substantially prevented in the metal gate member 109. Advantageously, satisfactory quality, performance, and/or reliability of the semiconductor device 1000 may be obtained.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
    providing a dummy gate structure on a semiconductor substrate, wherein the dummy gate structure comprises a dummy gate member, an intermediate layer, and a mask layer, wherein the dummy gate member is positioned between the semiconductor substrate and the intermediate layer, and wherein the intermediate layer is positioned between the dummy gate member and the mask layer;
    providing an insulating structure, such that the dummy gate structure is positioned between two portions of the insulating structure;
    providing an etch-stop material layer that covers both the dummy gate structure and the insulating structure;
    providing a dielectric material layer that covers the etch-stop material layer;
    removing each of the mask layer, a portion of the etch-stop material layer that is positioned above the intermediate layer, and a portion of the dielectric material layer that is positioned above the intermediate layer;
    removing the intermediate layer or a remaining portion of the intermediate layer;
    partially removing a remaining portion of the insulating structure to form a first cavity portion;
    removing the dummy gate member to form a second cavity portion, wherein the second cavity portion is positioned between the semiconductor substrate and the first cavity portion, and wherein a width of the second cavity portion is less than a width of the first cavity portion; and
    providing a set of gate metal material through the first cavity portion into the second cavity portion for forming a metal gate member.

2. The method of claim 1, wherein a bottom portion of the first cavity portion is positioned between the semiconductor substrate and a top portion of the first cavity portion and is narrower than the top portion of the first cavity portion.

3. The method of claim 1, wherein a cross section of the first cavity portion has a trapezoid shape.

4. The method of claim 1, wherein a width of the metal gate member is equal to a width of a bottom portion of the first cavity portion.

5. The method of claim 1, wherein a thickness of the metal gate member is equal to a height of the second cavity portion.

6. The method of claim 1, wherein a thickness of the dummy gate member is equal to a thickness of the metal gate member.

7. The method of claim 1 comprising: configuring a thickness of the dummy gate member according to a predetermined thickness of the metal gate member.

8. The method of claim 1, wherein a height of the first cavity portion is less than or equal to a thickness of the intermediate layer.

9. The method of claim 1, wherein a height of the first cavity portion is equal to a thickness of the remaining portion of the intermediate layer.

10. The method of claim 1 comprising: controlling a height of the first cavity portion by partially removing the intermediate layer in a process step performed for removal of the mask layer, the portion of the etch-stop material layer, and the portion of the dielectric material layer.

11. The method of claim 1 comprising: configuring a thickness of the intermediate layer according to a predetermined height of the first cavity portion.

12. The method of claim 1, wherein the dummy gate member is formed of a polycrystalline silicon material, and wherein the intermediate layer is formed of a metal material.

13. The method of claim 1, wherein the mask layer comprises a silicon oxide layer and a silicon nitride layer, and wherein the silicon oxide layer is positioned between the intermediate layer and the silicon nitride layer.

14. The method of claim 1 comprising: performing a wet strip process for removing the dummy gate member, wherein a removal rate associated with a material of the dummy gate member is higher than a removal rate associated a material of the dielectric material layer.

15. The method of claim 1 comprising: etching the remaining portion of the insulating structure to form the first cavity portion and the two insulating portions, wherein the remaining portion of the insulating structure comprises two nitride members and two oxide members, wherein the two nitride members are positioned between the two oxide members, and wherein an etch rate associated with the nitride members is higher than an etch rate associated with the oxide members in the etching.

16. The method of claim 15, wherein the etch rate associated with the nitride members is greater than or equal to 30 times the etch rate associated with the oxide members in the etching.

17. The method of claim 15 comprising: using $CHF_3$ and $O_2$ in the etching.

18. The method of claim 15, wherein a depth of material removal associated with the etching is in a range of 10 angstroms to 100 angstroms.

19. The method of claim 1, wherein the two insulating portions include two nitride portions and two oxide portions, and wherein the two nitride portions are positioned between the two oxide portions and are shorter than the two oxide portions.

* * * * *